United States Patent
Acker

(10) Patent No.: US 10,571,307 B2
(45) Date of Patent: Feb. 25, 2020

(54) ELECTRONIC CONTROL DEVICE

(71) Applicant: Continental Teves AG & Co. oHG, Frankfurt (DE)

(72) Inventor: Heinrich Acker, Schwalbach (DE)

(73) Assignee: Continental Teves AG & Co. oHG, Frankfurt (DE)

(*) Notice: Subject to any disclaimer, the term of this patent is extended or adjusted under 35 U.S.C. 154(b) by 0 days.

(21) Appl. No.: 15/741,593

(22) PCT Filed: Jul. 29, 2016

(86) PCT No.: PCT/EP2016/068158
§ 371 (c)(1),
(2) Date: Jan. 3, 2018

(87) PCT Pub. No.: WO2017/025355
PCT Pub. Date: Feb. 16, 2017

(65) Prior Publication Data
US 2018/0195881 A1 Jul. 12, 2018

(30) Foreign Application Priority Data
Aug. 11, 2015 (DE) .................. 10 2015 215 331

(51) Int. Cl.
*G01D 5/243* (2006.01)
*G01R 27/26* (2006.01)
(Continued)

(52) U.S. Cl.
CPC .............. *G01D 5/243* (2013.01); *G01B 7/003* (2013.01); *G01B 7/02* (2013.01); *G01R 27/2605* (2013.01); *G01R 27/2611* (2013.01)

(58) Field of Classification Search
CPC .............. G01D 5/243; G01R 27/2611; G01R 27/2605; G01B 7/003; G01B 7/02
See application file for complete search history.

(56) References Cited

U.S. PATENT DOCUMENTS 4,969,363 A * 11/1990 Mochizuki .............. G01F 1/002
324/439
5,027,066 A  6/1991 Reder
(Continued)

FOREIGN PATENT DOCUMENTS

CN  101501454 A  8/2009
CN  101545754 A  9/2009
(Continued)

OTHER PUBLICATIONS

German Search Report for German Application No. 10 2015 215 331.2, dated Nov. 28, 2016 with partial translation, 13 Pages.
(Continued)

*Primary Examiner* — Christopher P McAndrew
*Assistant Examiner* — Zannatul Ferdous
(74) *Attorney, Agent, or Firm* — RatnerPrestia

(57) ABSTRACT

An electronic control unit for a device for measuring a measurement variable, wherein a first inductance is supplemented by a capacitance to form a parallel resonant circuit and is excited by a micro-controller. A measuring inductance coupled to the first inductance is measured by the electronic control unit. Therefore, a measured variable can be deduced and only very few components are required in addition to the electronic control unit.

18 Claims, 5 Drawing Sheets

(51) Int. Cl.
*G01B 7/00* (2006.01)
*G01B 7/02* (2006.01)

(56) References Cited

U.S. PATENT DOCUMENTS

| | | |
|---|---|---|
| 5,703,576 A | 12/1997 | Spillman et al. |
| 5,952,822 A | 9/1999 | Kayserman et al. |
| 6,316,931 B1* | 11/2001 | Nakagawa ............. G01R 15/20 |
| | | 324/117 R |
| 7,719,264 B2 | 5/2010 | Tiemann |
| 8,339,126 B2 | 12/2012 | Izak et al. |
| 8,421,446 B2 | 4/2013 | Straubinger et al. |
| 8,730,011 B2 | 5/2014 | Altmann et al. |
| 9,188,421 B2 | 11/2015 | Prüssmeier et al. |
| 2003/0107377 A1 | 6/2003 | Uzman |
| 2004/0200260 A1* | 10/2004 | Klosterman .......... B01L 3/0293 |
| | | 73/1.74 |
| 2009/0243596 A1* | 10/2009 | Izak ..................... G01D 5/2053 |
| | | 324/207.16 |
| 2010/0156402 A1 | 6/2010 | Straubinger et al. |
| 2012/0242380 A1 | 9/2012 | Edwards |
| 2013/0187643 A1* | 7/2013 | Lysen ................ G01N 27/9046 |
| | | 324/238 |
| 2013/0207626 A1* | 8/2013 | Chiba .................... G05F 1/468 |
| | | 323/271 |
| 2014/0043017 A1* | 2/2014 | Patterson, III ......... G01B 7/004 |
| | | 324/202 |
| 2015/0048893 A1* | 2/2015 | Heid ........................ H01P 7/06 |
| | | 331/96 |
| 2016/0006441 A1* | 1/2016 | van der Wagt ....... H03L 7/0802 |
| | | 327/158 |
| 2018/0188076 A1* | 7/2018 | Acker .................... G01D 5/243 |
| 2018/0287603 A1 | 10/2018 | Subramanian et al. |

FOREIGN PATENT DOCUMENTS

| | | | |
|---|---|---|---|
| CN | 101963514 A | 2/2011 | |
| CN | 102003973 A | 4/2011 | |
| CN | 103562683 A | 2/2014 | |
| CN | 103278181 B | 3/2016 | |
| DE | 4330140 A1 | 3/1995 | |
| DE | 3903278 C2 | 9/1995 | |
| DE | 19725806 A1 | 1/1999 | |
| DE | 19745236 A1 * | 5/1999 | ........... G01D 5/2013 |
| DE | 19745236 C2 | 12/2000 | |
| DE | 10128010 A1 | 1/2003 | |
| DE | 60029113 T2 | 12/2006 | |
| DE | 102006026543 A1 | 12/2007 | |
| DE | 102006046531 A1 | 4/2008 | |
| DE | 102008015837 A1 | 10/2009 | |
| DE | 102009027997 A1 | 1/2011 | |
| EP | 0629842 B1 | 3/1999 | |
| EP | 1744184 A2 | 1/2007 | |
| EP | 1391735 B1 | 10/2012 | |

OTHER PUBLICATIONS

International Search Report and Written Opinion for International Application No. PCT/EP2016/068158, dated Nov. 18, 2016, 8 Pages.
Notice of Allowance for U.S. Appl. No. 15/740,562, dated Oct. 23, 2019, 13 pages.
Chinese Office Action for Chinese Application No. 201680042609.2, dated Aug. 2, 2019, with translation, 20 pages.
European Decision to. Grant a Patent for European Application No. 16753607.7, dated Oct. 23, 2019, 45 pages.

* cited by examiner

ELECTRONIC CONTROL DEVICE

CROSS REFERENCE TO RELATED APPLICATIONS

This application is the U.S. National Phase Application of PCT International Application No. PCT/EP2016/068158, filed Jul. 29, 2016, which claims priority to German Patent Application No. 10 2015 215 331.2, filed Aug. 11, 2015, the contents of such applications being incorporated by reference herein.

FIELD OF THE INVENTION

The invention relates to an electronic control unit for an apparatus for measuring a measured variable. In particular, such an apparatus may be an inductive sensor.

BACKGROUND OF THE INVENTION

Inductive sensors are typically based on a change in one or more characteristic values of a system of one or more inductive devices as a result of a measured variable. Inductive devices of this kind can refer to a coil, winding or inductance, for example.

Possible characteristic values are, in particular:
self inductance L, also called inductance for short,
resistance loss R, which is made up of a nonreactive resistance of the winding and other loss contributions,
complex impedance $Z=j\omega L+R$ with the imaginary unit j and the angular frequency $\omega$,
loss angle $\delta=\arctan(Re\{Z\}/Im\{Z\})$,
and, particularly in the case of the magnetic coupling between multiple devices, mutual inductance M. The mutual inductance M can be measured indirectly as an induced voltage in one conductor in reaction to a known current in another conductor, inter alia.

Measured variables that bring about the change in the characteristics values may be position or length, angle, force, pressure or torque, inter alia. An application that can be cited by way of example is a position sensor for the brake pedal of an automobile.

For inductive sensors, there are particularly two main approaches to circuitry that exist in the prior art in order to perform electrical measurement of the characteristic values:

First, this is a resonant system: The inductive sensor with its variable characteristic value, more often than not of the inductance L, is part of the frequency-determining network of an oscillator. The oscillator always oscillates at its natural frequency, the most important influencing factor of which is L. The measurement of L is therefore committed to a frequency measurement that can easily be performed e.g. by counting the periods or zero crossings of the oscillator oscillation.

Second, this is a lock-in amplifier (also phase-sensitive rectifier, synchronous demodulator or carrier frequency amplifier): The inductive sensor is provided with a stimulus at a fixed frequency (current or voltage). A signal processing circuit measures the respective other electrical variable using the impedance (voltage or current). The signal processing is consistent with narrowband filtering of this variable around the frequency of the stimulus with subsequent determination of the complex amplitude and quotient formation with the stimulus to determine the characteristic value. These functions can be realised either using analog electronics or largely using the means of digital signal processing and software.

The two approaches have different disadvantages.

The resonant system has limitations for the conception of the inductive system, because only one oscillation per oscillator is possible. Multiple signals can be obtained only using multiple independent oscillators and inductive systems, which significantly increases the outlay for sensors with ratiometric or differential measurement. Furthermore, the inductive system always has frequency dependencies, i.e. it can only be designed in optimum fashion for one frequency; the frequency range of the oscillator is always a compromise. Via the alteration of the oscillation frequency, cross-sensitivities can corrupt the measurement result, for example because the inductance L in addition to the sensitivity to the measured variable is influenced by a further frequency-dependent variable. Finally, the difference between the maximum and minimum count results of the frequency measurement must exceed a minimum value for the respective demands on measurement accuracy and measurement resolution to be met. This requires a minimum measurement time, depending on frequency, that is sometimes not available at all.

The lock-in amplifier, by contrast, operates at a constant frequency, but also requires a stimulus at this frequency. The frequency of these enforced oscillations is freely selectable, but the frequency dependency of the inductive system means that this is an inconsistency for operation at resonance, i.e. with oscillations at the natural frequency. It is thus not possible for the following advantages of resonance to be used: The inductive system, operated as a resonator, is already a filter by virtue of its being able to achieve at its natural frequency a particularly high amplitude that facilitates the measurement. Interference whose frequency differs significantly from this frequency is rejected by the filter action. Furthermore, the power requirement of the inductive system to maintain the oscillation is at its lowest at resonance if all other parameters remain the same. For a given power of the stimulus, a particularly high amplitude is therefore possible. These two advantages are naturally the same substantive matter, once from the point of view of the measurement and once from the point of view of the stimulus.

SUMMARY OF THE INVENTION

Therefore an aspect of the invention aims to provide an electronic control unit for an, in comparison with the prior art, alternative, in particular improved, apparatus for measuring a measured variable.

An aspect of the invention relates to an electronic control unit for an apparatus for measuring a measured variable. The electronic control unit is configured to be connected directly to a parallel resonant circuit that is formed from a first inductance and a capacitance. The electronic control unit is configured to excite the parallel resonant circuit into oscillation at an excitation frequency that is derived from a clock of the electronic control unit.

The electronic control unit is further configured to be connected directly to at least one measurement inductance that is set up to detect the measured variable and that is coupled to the first inductance. Moreover, it is configured to measure a value revealing the measured variable using the measurement inductance.

An electronic control unit of this kind allows the design of an apparatus having particularly advantageous properties. An apparatus of this kind for measuring a measured variable typically has a first inductance. It has a measurement inductance that is set up to detect the measured variable and that is coupled to the first inductance. Moreover, it has a capacitance that is interconnected with the first inductance to form a parallel resonant circuit.

The apparatus moreover has the electronic control unit according to the invention. The electronic control unit is connected directly to the parallel resonant circuit and, as described, is configured to excite the parallel resonant circuit into oscillation at an excitation frequency. Moreover, the electronic control unit is connected directly to the measurement inductance and is configured to measure a value revealing the measured variable using the measurement inductance.

By means of the apparatus that can be designed using the electronic control unit according to the invention, the measurement inductance can be measured merely using an electronic control unit in a resonant circuit. This saves energy, since the resonant circuit oscillates of its own accord and as a rule there is only a readjustment for lost energy. An enforced oscillation thus takes place. This allows use of the advantages of resonance and is free of the aforementioned restrictions of a resonant system. The use of an electronic control unit for implementing the functions saves costs and simplifies the system.

The excitation of the resonant circuit can also be referred to as a stimulus. The excitation frequency can also be referred to as a stimulus frequency. The derivation of a clock can be effected particularly through the derivation of an internal, but also an external, clock. This means particularly that the excitation frequency is independent of a resonant frequency of the parallel resonant circuit.

In particular, the apparatus may be designed such that it does not have an amplifier external to the electronic control unit. This likewise saves costs. Typically, the provision of a direct connection precludes a respective amplifier between the electronic control unit and a component such as an inductance or capacitance, or resonant circuit. A respective amplifier may be integrated particularly in the electronic control unit.

The excitation frequency may be prescribed or set particularly at a prescribed spacing from the resonant frequency of the parallel resonant circuit. The action of a resonant circuit close to the resonant frequency, even without resonant oscillation, brings about four advantages according to the invention:

1. The voltage spikes and hence the danger to the port pins disappear.
2. The current through the inductances rises significantly, hence more magnetic flux is produced in the inductive system, synonymous with a stronger signal.
3. The current through the inductances becomes almost sinusoidal, which is favorable from the point of view of electromagnetic compatibility and advantageous for the downstream signal processing.
4. The current in the supply lines to the resonant circuits falls because the impedance of the resonant circuit is particularly high close to resonance. This allows the stimulus to be produced with few port pins or output stages with low current-carrying capability.

To protect the port pins from voltages outside the permissible range, the complementary stimulus is advantageous, because it brings about an oscillation around the mean value of the supply voltage. In this case, an amplitude of likewise half the supply voltage is possible or permissible; depending on the specification of the microcontroller, also beyond, for example up to half the supply voltage+0.5 V. The voltages on the port pins are typically no longer square-wave voltages on account of the internal resistance of the output stages. A stimulus that operates on the input side with port pins nearing reference-ground potential or supply voltage typically does not afford any comparable options, since any stimulus (AC voltage) added to these voltages is outside the permissible range even at low amplitudes.

An electronic control unit can be understood to mean a microprocessor or a microcontroller, for example. In this case, a microcontroller can be understood to mean particularly a device that includes not only the functions of a microprocessor but also read-write memory (RAM), at least one type of read-only memory (ROM, EPROM, EEPROM, flash, or the like), analog-to-digital converters (ADC) and/or timer and port components integrated on a chip. Such a device typically requires no external memory for operation and can execute a program without external circuitry and can perform measurements with the ADC and can output digital signals via port pins that are determined by software or by the timer components. To this end, the microcontroller is typically provided merely with a voltage and clock supply and a reset pulse when switched on. In the case of modern devices, a clock oscillator and a piece of reset logic may also be incorporated, so that typically only the supply voltage is supplied from the outside.

However, the electronic control unit may also be an arrangement comprising a microprocessor with external circuitry such as memory and clock supply, an application-specific integrated circuit (ASIC), a programmable logic controller (PLC) or an integrated circuit (IC), for example.

Preferably, there is provision for the electronic control unit to be set up as an application-specific integrated circuit, ASIC, and/or as an application-specific standard product, ASSP. This allows cost advantages through mass production that justify a certain amount of development effort.

For measuring, an analog-to-digital converter (ADC) of the electronic control unit is typically used. In most control units that can typically be used, the ADC is connected via a multiplexer to a number of port pins on which the voltage can be measured. The number of port pins used as input and, the sequence in which the inputs are connected to the ADC are typically configurable. The port pins connected to the multiplexer are therefore available as inputs for performing multiple independent measurements.

It is assumed that the measurement results are for the most part not only meant to remain in the electronic control unit, but rather are forwarded to other systems, for example by a serial interface. For this purpose, there may be suitable devices.

It is also possible for an integrated circuit (IC) to be regarded or defined as an electronic control unit that includes the circuit functions cited above. This does not require the IC also to be marketed as an electronic control unit by the manufacturer or to be freely available commercially as a standard chip. In that sense, particularly an ASIC ("Application-Specific Integrated Circuit", particularly an IC developed for a customer application) that satisfies all the technical criteria is deemed to be an electronic control unit.

A possible value revealing the measured variable is particularly:
  self inductance L, also called inductance for short,
  resistance loss R, which is made up of a nonreactive resistance of the winding and other loss contributions,
  complex impedance $Z=j\omega L+R$ with the imaginary unit j and the angular frequency $\omega$,
  loss angle $\delta=\arctan(\text{Re}\{Z\}/\text{Im}\{Z\})$,
  and, particularly in the case of a magnetic coupling between multiple devices, mutual inductance M. The mutual inductance M can be measured indirectly as an induced voltage in one conductor in reaction to a known current in another conductor, inter alia.

From the value revealing the measured variable, it is typically possible to infer the measured variable, for example the measured variable can be computed or looked up in a table.

According to a preferred embodiment, the electronic control unit is set up for the parallel resonant circuit to be connected to a first port pin and to a second port pin of the electronic control unit. Cleverly, the second port pin is then supplied with an excitation signal that is inverted in relation to the first port pin.

The effect that can be achieved by this is that an oscillation of the parallel resonant circuit is effected not around a reference-ground potential, particularly ground, or around the supply voltage, but rather around half the supply voltage or at least around approximately half the supply voltage. This avoids endangerment of the electronic control unit or of the port pins or the circuitry thereof.

The excitation frequency can be reached particularly by dividing down or adopting a system clock on the port pin. This allows the provision of a signal clocked at the excitation frequency on the port pin using established functionality of an electronic control unit.

The stimulus can be derived particularly from a system clock of an electronic control unit. To this end, it is possible for a timer or counter to be used. This typically divides down the clock to the frequency of the stimulus in an integer ratio. In some cases, direct use of the system clock is also possible. The divided clock is preferably connected to the output stages of two or more port pins, one port pin or a group of port pins being actuated with the clock itself, whereas a second port pin or a second group of port pins are actuated with the inverted clock. Depending on the architecture of an electronic control device, it may be necessary in this case to use a separate timer for each port pin, because each timer can be connected only to one particular port pin, without there being an opportunity to branch the timer signal. This circumstance is not a problem for the most part, because modern control units typically have many timers and for the most part only a few port pins are needed, a minimum of two.

Since the frequency of the stimulus can be selected by adjusting the timer, this frequency can optionally be altered by software during the operation of the system.

According to one embodiment, a respective resistor, particularly a nonreactive resistance, may be interconnected between a number of the port pins and an inductance, that is to say, by way of example, the first inductance or the measurement inductance. This is also intended to be understood by a direct connection. The resistor can particularly be used to limit a current, which avoids damage on account of overload.

The electronic control unit may be set up for the parallel resonant circuit to be connected in parallel with the first port pin to a number of further first port pins that are connected in sync with the first port pin. The electronic control unit may also be set up for the parallel resonant circuit to be connected in parallel with the second port pin to a number of further second port pins that are connected in sync with the second port pin. It is thus possible for the respective maximum current loadings of the port pins to be added, so that overall a higher maximum current can be reached than when only one port pin is used.

In this case, synchronous connection is intended to be understood to mean particularly that fundamentally the same potential is applied to the respective port pins, that is to say that said potential is also switched over at the same time. The electronic control unit is preferably designed or configured for a synchronous connection of this kind.

The voltages on the port pins are used particularly as a stimulus. There are primarily two reasons to use a respective group of port pins optionally instead of a single port pin that is supplied with the clock and a single port pin that is supplied with the inverted clock. First, a number of port pins that have an excessively low current-carrying capability can, through parallel connection, provide a multiple current in accordance with the number, as already mentioned further above. It is thus possible for a stimulus to be supplied to inductive systems whose impedance would otherwise be too low. Second, the inductive system can provide multiple inductances to be supplied with a stimulus. In this case, the use of one timer per port pin can optionally also allow the individual inductances to be supplied with stimuli of different frequency or phase.

It should therefore be mentioned that it is also possible for further inductances to be connected to further port pins.

As a preference, port pins to which the parallel resonant circuit is connected have a push-pull output stage or a tri-state output stage. This can mean particularly that there is a switching element (bipolar or MOS transistor) for a low-impedance connection to each of the voltages of the two logic levels. Such embodiments have been found to be advantageous for the present application.

According to a preferred embodiment, there is provision for the excitation frequency to differ from a resonant frequency of the parallel resonant circuit by no more than 25%, preferably no more than 20%, particularly preferably no more than 15%, even more preferably no more than 10%. In particular, the electronic control unit may be set up to provide such an excitation frequency. It may be set up to ascertain the resonant frequency, for example as described further below. It may also be set up to provide a defined spacing between the excitation frequency and the resonant frequency and/or to prevent equality of the excitation frequency and the resonant frequency. This achieves an advantageous excitation. Operation of resonant frequency is typically not intended, but can normally be tolerated as a borderline case.

The connection of the stimulus, as particularly also the measurement circuit described herein, is easily scaled and can be done at excitation frequencies from the kHz range to the MHz range, e.g. preferably from 5 kHz to 5 MHz, without changing the demands on the electronic control unit or the microcontroller. This typically involves only the parameters of the inductive system and of the capacitor of the resonant circuit being customised. The lower limit of 5 kHz particularly causes the inductances to be able to be embodied in sufficiently small size and to influence the system on which measurements are to be taken as little as possible. The upper limit particularly causes the parasitic capacitances of the port pins and of the connected external network together with the internal resistances of the output stages not to form low-pass filters that are then active. However, it should be understood that frequencies outside the indicated range can also be used, since maximum tolerable influences are always dependent on the actual circumstances.

Within the sought stimulus frequency range, the upper range, e.g. from 500 kHz to 5 MHz, is suitable as a preference for many measurement tasks, particularly in automobiles. The inductive system is then very small and can, as the required inductances are only a few microhenries, also be integrated onto a printed circuit board compactly and inexpensively in the form of planar coils. If the inductive system is realised in the form of planar coils, then a stimulus frequency in the upper range is particularly preferred, because the impedances in the inductive system otherwise typically become too small to be accessible for a precise measurement without a high level of effort.

As a preference, the electronic control unit is set up to measure the measurement inductance as well when it has a first pole connected to a port pin of the electronic control unit and has a second pole connected to a potential that corresponds to at least approximately half the supply voltage of the electronic control unit.

In this case, at least approximately half the supply voltage can be understood to mean particularly a value that has a deviation of ±10% or ±5% from half the supply voltage. It is also possible for exactly half the supply voltage to be used. A deviation from this exact value does not lead to a measurement error, but rather can possibly merely impair the achievable resolution.

The potential that corresponds to at least approximately half the supply voltage of the electronic control unit can be produced by means of a voltage divider, for example.

The potential that corresponds to at least approximately half the supply voltage of the electronic control unit can also be produced by means of a smoothing capacitor, wherein the smoothing capacitor has a first pole connected to a reference-ground potential or to the supply voltage, and wherein a second pole of the smoothing capacitor is connected via a resistor to a port pin of the electronic control unit, which port pin has a pulsed signal, particularly a signal having a prescribed duty ratio, applied to it.

The electronic control unit may accordingly be set up to output a pulsed signal, particularly a signal having a prescribable duty ratio, on a port pin in order to produce the potential that corresponds to at least approximately half the supply voltage of the electronic control unit by means of the smoothing capacitor.

In this case, the resistor may be designed particularly to achieve a small residual ripple, said resistor preferably having a resistance value of above 100 kΩ.

The embodiments just described are based on the insight that the voltages on the port pins are typically permitted to exceed the limits provided by the supply voltage only to a minimum degree. For the secondary windings of a measurement transformer, this means that they preferably do not simply have the input side connected to reference-ground potential or VDD and the other connection connected to the port pin, since in such a case just small amplitudes would typically lead out of the supply voltage range. Instead, as a preference, the indicated potential of approximately half the supply voltage is used to allow maximum amplitudes.

This can be achieved with a simple voltage divider, which is equivalent to a simple embodiment. It is also possible, as indicated, for an RC element to be used. The input side of the capacitor is connected to the supply voltage or reference-ground potential, and the other side is connected to a connection of a secondary winding of the measurement transformer. This node likewise has the resistor connected to it, the value of which is typically in the region above 100 kΩ. The other side of the resistor is connected to a port pin. Typically, the output stage in this case changes between the logic levels and possibly also the high-impedance state of a tri-state output stage under timer control in order to keep the capacitor voltage approximately at half the supply voltage. It is particularly advantageous in this case if timers of the microcontroller can form a pulse width modulator, because then the correction of parameter changes requires only the pulse width modulation (PWM) ratio to be adjusted. A central unit is then encumbered only a little by this task. The resistor value in the RC element is preferably meant to be high so that the voltage has only a low residual ripple at half the supply voltage. On account of the filter action of the measurement circuit, the effect of the residual ripple can be minimised by virtue of the signal frequency that is meant to be measured by an analog-to-digital converter (ADC) keeping an adequate spacing from the PWM frequency.

The RC element particularly affords the opportunity to achieve a further improvement in the metrological properties of the circuit. The residual ripple on the capacitor can be used deliberately as what is known as "dither" in order to increase the resolution of the measurement. In this case, an auxiliary signal of low amplitude (the residual ripple) is added to a useful signal. Repeated sampling of the summed signal then allows the resolution to be increased for the measurement of the useful signal. The process is known by the name "dithering". It should be mentioned that dithering can also be provided otherwise, that is to say without an RC element, for example.

The filter function can also be provided by other passive low-pass filters instead of the simple RC element.

As a preference, the electronic control unit is configured to first of all, when it is switched on, charge the smoothing capacitor to at least approximately half the supply voltage, while port pins to which the parallel resonant circuit is connected have the same logic level and begin excitation of the parallel resonant circuit only afterwards.

In regard to the advantageous nature of this approach, the following can be stated:

The use of inductances gives rise to the risk of overvoltages that can destroy a microcontroller both on the port pins that produce the stimulus and on the port pins that are used for the measurement. Measures for protecting the microcontroller, such as a resistor connected in series, relate to the steady state. When the system is switched on, however, overvoltages can arise even if the circuit is designed such that there is no risk in the steady state. To prevent damage, a protection-oriented switch-on procedure is advantageous if the use of protective devices specifically for the switch-on process is to be avoided. This is a cycle that can be performed by the central unit of the electronic control unit or of the microcontroller by program. As soon as the steady state has been reached, typically no further separate measures are needed and the measurement mode can begin.

The switch-on procedure preferably begins with the measurement circuit, during which the stimulus still remains switched off. All the existent RC elements or passive low-pass filters that are used for producing a voltage of approximately half the supply voltage are preferably pre-charged so that they can fulfil their purpose. If the stimulus is activated before approximately half the supply voltage has been reached at the applicable nodes, then the induced voltages can lead to an infringement of the permissible voltage range. In this connection, there is a troublesome effect in that the resistance of the RC elements needs to be high, as described above, since this means that pre-charging can take a very long time, causing an undesirable delay between the supply voltage being switched on and the sensor system being ready for measurement. This can be avoided by virtue of the capacitances of the RC elements being charged by the likewise connected inductances and the applicable port pins instead. To this end, it may be necessary to provide current limiting resistors on these port pins if there are no output stages or configurations of output stages that can be used to perform current limiting in the microcontroller, for example using switchable integrated pull-up resistors.

While the pre-charging of the RC elements is ongoing, the two connections of the electronic control unit and of the microcontroller that provide the stimulus are meant to have the same logic level so that no current flows through the applicable inductance. The inductance has very low impedance to direct current and is tantamount to a short circuit, which would destroy these connections. The high-impedance state of tri-state outputs is also advantageous. When the stimulus is finally started, it is preferably meant to be activated on both connections almost at the same time in order to keep the inevitable short circuit on the first level change of the first connection as short as possible. The program preferably needs to be written and the electronic control unit preferably needs to be configured such that the delay between the activation times of the outputs is deterministic by virtue of other activities being blocked, e.g. no interrupt being permitted.

The electronic control unit preferably has an analog-to-digital converter in order to capture a signal generated by the measurement inductance, aliasing being taken into consideration when determining the characteristic values of said signal, particularly amplitude, phase, real part and/or imaginary part, preferably at the excitation frequency.

Advantageously, the electronic control unit is configured to ascertain a frequency component at an evaluation frequency from a signal captured in the electronic control unit, wherein the evaluation frequency is particularly the excitation frequency or an alias of the excitation frequency.

In regard to such embodiments, the following observations will be made.

If the chosen stimulus frequency is so high that the Nyquist frequency of the ADC is below it even at the maximum possible sampling rate, then undersampling can be used deliberately. In this case, the signal of the stimulus appears as a result of aliasing at a frequency below the respective Nyquist frequency at the output of the ADC; in this case, aliasing is thus not interference or an exclusion criterion, but rather is desirable. From a communications engineering point of view, the stimulus is an amplitude-modulated carrier, since if the measured variable changes then there is amplitude modulation (AM) of the stimulus with the measured variable. This results in the width of the AM sidebands and the requirement that the sampling rate for correct operation of the system according to the invention preferably needs to be at least four times as high as the bandwidth in the measured variable for the bands not to overlap through aliasing so as to interfere, since the AM signal has twice the bandwidth of the signal of the measured variable. Since the signal of the stimulus itself has a very narrow bandwidth—the coil current is typically almost sinusoidal as a result of the addition of the inductive system to the resonant circuit—and the bands for low-frequency measured variables can easily be made narrow relative to the Nyquist bandwidth of the analog-to-digital converter (ADC), no separate measures are necessary in order to prevent undesirable overlapping of bands through aliasing and hence corruption of the signal.

Since the measurement inductance or, generally, the inductances at which the voltages to be measured are tapped off typically have low impedance, noise is not a significant problem. Only the low nonreactive resistance of the inductances is a noise source. For the same reason, it is typically necessary for wideband interference sources in the surroundings of the sensor to have very large amplitudes in order to substantially influence the measurement: the low nonreactive resistance acts almost as a short circuit for capacitively or inductively coupled interference sources, because almost the entire interference voltage is dropped across the coupling impedance. Only narrowband sources of interference achieve amplitudes, for most applications, that are relevant to the measurement circuit. Hence, likewise narrowband filtering of the voltages to be measured makes sense.

Such filtering is typically effected digitally by virtue of a series of samples of the ADC being used in order to isolate the stimulus frequency in the input frequency mix. This can be accomplished by using an implementation of the DFT (Discrete Fourier Transformation) whose algorithm is executed by a central unit of the electronic control unit or of the microcontroller. A particular preference is the use of a Goertzel filter or Goertzel algorithm, which can deliver the absolute value and phase of a single spectral line of the DFT in numerically particularly efficient fashion. The frequency that can be chosen for this spectral line is preferably the frequency of the stimulus, that is to say the excitation frequency or that alias frequency that arises as a result of undersampling of the excitation frequency.

According to one embodiment, the measurement inductance is DC coupled to the first inductance. According to a further embodiment, the measurement inductance is magnetically coupled to the first inductance. The measurement inductance may particularly be coupled to the first inductance by virtue of setup as a measurement transformer. Such embodiments have been found to be advantageous for typical applications.

The first inductance, the measurement inductance and/or the capacitance are preferably components having a respective tolerance of between 1% and 10%, preferably of 1%, or of less than 1%. In this case, the tolerance typically prescribes the design-dependent maximum deviation from a setpoint value. In the present case, correspondingly low tolerances facilitate the design of the apparatus particularly within the context of mass production, since with a low tolerance the maximum deviation in the resonant frequency of the parallel resonant circuit is also correspondingly small.

According to a preferred embodiment, there is provision for
the parallel resonant circuit to have a maximum Q factor obtained through maximisation of a value of Vt*Vt/V0,
where Vt denotes a ratio of coil current and supply line current given maximum deviation of the capacitance and of the first inductance from their respective values at the resonant frequency of the parallel resonant circuit, and
where V0 denotes a ratio of coil current and supply line current for respective values of capacitance and first inductance at the resonant frequency of the parallel resonant circuit.

The maximum Q factor can be limited particularly by interconnection of a resistor in the parallel resonant circuit.

The maximum deviation is typically prescribed by the tolerance, that is to say the maximum deviation—already mentioned further above—from the setpoint value, of the respective component.

In regard to the Q factor and the advantageous embodiment just mentioned, a few explanations are provided below.

Passive devices in electrical engineering, such as e.g. coils and capacitors, are usually offered with tolerances for their characteristic values that typically lie between 1% and 10%. Even lower values than 1% lead for the most part to very high costs for the devices. Tolerances of more than 10%, by contrast, make it difficult for circuits to be designed meaningfully at all. If a resonant circuit is designed using tolerance-exhibiting devices having the characteristic values L and C (capacitance), then the oscillation formula for the resonant frequency $\omega_0=1/\sqrt{(LC)}$ reveals that the tolerance of the resonant frequency $\omega_0$ corresponds to the geometric mean $\sqrt{(LC)}$ of the tolerances of the devices. The tolerance of the resonant frequency of resonant circuits that are designed using the usual devices therefore likewise fluctuates in the range from 1% to 10%. If a resonant circuit is designed such that its nominal resonant frequency matches the frequency of the stimulus, that is to say the excitation frequency, then it must be assumed that the real resonant frequency deviates by ±1% to ±10%.

An important property of resonant circuits is their Q factor Q. This is a measure of the losses that arise in the circuit as a result of the nonreactive resistance, and of the decay of a free oscillation. The higher the Q factor, the lower the losses and the slower the decay.

FIG. 1 shows a family of curves that shows the effect of the Q factor on the benefit of the addition of the inductive system to the resonant circuit in regard to the stimulus, that is to say the excitation by the excitation circuit. What is plotted is the ratio of the current $I_L$ through the excited inductance to the current $I_{St}$ of the stimulus. Without the addition of the inductive system to the resonant circuit, this ratio would always be equal to one, because there is no further current path. Since the current $I_L$ corresponds to the useful current, because it produces the magnetic flux, while the current $I_{St}$ corresponds to the effort, the plotted quotient signifies a rating factor for the benefit. Values greater than one correspond to a gain. This benefit is plotted over the angular frequency $\omega$ normalised to the resonant circuit frequency $\omega_0$. The family parameter is the Q factor; in this case, the value at $\omega_0$ in each curve corresponds to the value of the Q factor, i.e. the curves show the Q factor Q with the values 8; 6; 4; 2; 1; $1/\sqrt{2}$ (from top to bottom).

Looking now at the benefit of the addition of the inductive system to the resonant circuit at frequencies that deviate from the resonant circuit frequency $\omega_0$ by ±10%, for example, it can be seen that a high level of benefit can also be established for these frequencies, not just for the nominal frequency. The higher the Q factor, however, the higher the ratio of the benefit at the resonant frequency $\omega_0$ and the benefit at a frequency that deviates by ±10%. The reason is the known relationship that the bandwidth of the resonance peak becomes ever narrower as Q factor increases. There is therefore the following conflict of aims for the design of the apparatus described herein: First, the Q factor should be as high as possible for the highest possible benefit conditional upon Q factor; second, a high ratio of the benefit in the middle (resonance) and at the edges of the tolerance range brings about a reduction in usability, which is explained as follows: Any standard measurement system, whether analog or digital, has a maximum input amplitude that typically must not be exceeded. Within the framework of this maximum, the relative resolution is proportional to the input signal, because the smallest distinguishable step in the input signal in the input signal range is constant. If the input signal range is now fully exhausted at resonance, then the benefit that results from FIG. 1 can also be used to the full. At the edges of the tolerance range, however, the benefit is reduced by the factor that results from the ratio of the benefit in the middle (resonance) and at the edges of the tolerance range.

The aim is optimum design of the sensor system in the course of the conception. It is first of all desirable to keep the tolerance of the device characteristic values L and C, or its geometric mean $\sqrt{(LC)}$, as low as possible. In this case, it is useful that in recent years capacitors having tolerances of 1% and better have become available and cheaper. The main importance for the optimisation is the optimum choice of Q factor, however. Generally, high Q factors can typically be used advantageously only in combination with low tolerances of the term $\sqrt{(LC)}$. The design process described below is therefore based on the idea of taking the availability of suitable capacitors with narrow tolerances and the conception of an inductive system for the respective application as a basis for stipulating a tolerance for $\sqrt{(LC)}$, from which the optimum Q factor can then be computed.

With the tolerance of $\sqrt{(LC)}$, the tolerance of the angular frequency $\omega$ is also stipulated by the oscillation formula. From FIG. 1, the value for $I_L/I_{St}$ can now be read off for $\omega_0$ (resonance) and $\omega_T$ (angular frequency given by the tolerance; the lower frequency limit can be chosen, the upper or both). This can also happen numerically; the computation of FIG. 1 from the supply line current $I_{St}$ and the coil current $I_L$ for a parallel resonant circuit of given Q factor is elementary electrical engineering and is a prerequisite for this. As a result, the variables $V0=I_L(\omega 0)/I_{St}(\omega_0)$ and $Vt=I_L(\omega_T)/I_{St}(\omega_T)$ are now known. For a frequency $\omega_T$, it then holds that: The fraction with which the input voltage range of the measurement system is exhausted is given by the term Vt/V0. At this frequency, the benefit obtained by the addition of the inductive signal to the resonant circuit is equal to Vt. Therefore, the factor with which the entire system benefits from the addition of the inductive signal to the resonant circuit is the product of the two terms: $Vt^2/V0$. Elementary transformations of the underlying equations allow this factor to be computed as a function of $\omega_0$, $\omega_T$ and Q. The optimisation of a system then consists in maximising $Vt^2/V0$, which yields a result for Q as a function of $\omega_0$ and $\omega_T$. Further elementary mathematical transformations also allow Q to be plotted as a function of $\omega_0$ and $\omega_T$. From such a representation, it is possible for Q to be read off directly, and this saves having to repeatedly insert values for Q into the computation for the maximum search. In both cases, the results for Q are always maximum values, i.e. for a correspondingly designed system with $\omega_0$ and $\omega_T$, Q is supposed never to exceed the computed values, because otherwise the underlying input signal range of the measurement system is infringed. In the event of a drop below the computed value of Q, no infringement occurs; the input signal range of the measurement system is merely not exhausted. This is important for the design of the resonant circuit, since an excessively high Q factor Q can always easily be lowered by adding a nonreactive resistance; however, it sometimes causes great difficulties to constructively increase a low Q factor Q given by the properties of the inductive system. The cause is the parasitic nature of the resistance loss in inductive devices, which is often high, particularly in sensor inductances, because their turns are extensive and the magnetic circuits are open.

Overall, the following advantageous procedure or the following process is obtained, combined from the explanations above:

1. Design of the inductive system (largely outside the theme of this application)
2. Stipulation of the operating frequency of the inductive system (largely outside the theme of this application, since determined by the design)
3. Selection of a capacitor having the lowest possible tolerance (this can be done particularly according to commercial criteria)
4. Computation of the geometric mean of the tolerance of the device values L and C
5. Determination of the frequency $\omega_T$ from (4.)

6. Repeated computation and maximisation of $Vt^2/V0$; result is the maximum permissible Q factor Q with the chosen parameters
7. Is the Q factor Q of the resonant circuit comprising L, C and its design-dependent resistance loss lower than the maximum permissible Q factor Q? If so, that's it!
8. If not, insert a resistor into the resonant circuit that lowers the Q factor to the maximum permissible value.

It should be understood that the process steps just described can, as a whole or in any subcombination, be an independent aspect of the invention.

These statements result particularly in the procedure described above for the determination of the Q factor.

The measured variable can be detected by altering a position of a magnetic core in the measurement inductance, for example. This can change the value of the inductance of the measurement inductance.

The measured variable can also be detected by altering a spacing between the measurement inductance and the first inductance. This is typically consistent with an embodiment as a measurement transformer, wherein the magnetic coupling is altered.

Moreover, the measured variable can be detected by altering a position of a magnetic and conductive, a nonmagnetic and conductive, or a magnetic and nonconductive, element adjacent to the measurement inductance and the first inductance, for example. This allows customisation to different tasks and circumstances. The element may be arranged between or else beside the first inductance and the measurement inductance, for example. Altering its position alters the coupling between the first inductance and the measurement inductance.

A magnetic and conductive element may be made from steel, for example. A nonmagnetic and conductive element may be made from aluminum, for example. A magnetic and nonconductive element may be made from ferrite, for example.

The measurement inductance may particularly be configured to detect a measured variable in the form of a position, a length, an angle, a force, a pressure and/or a torque. This is consistent with typical use scenarios.

The electronic control unit is preferably configured to measure one or more of the following characteristic values using the measurement inductance:
  self-inductance or inductance,
  resistance loss,
  complex impedance,
  angle loss,
  mutual inductance in relation to the first inductance.

From characteristic values of this kind, it is typically possible to infer the measured variable.

According to one development, there is provision for the apparatus to have two, three or more than three measurement inductances or for the electronic control unit to be configured therefor. These may be configured to be movable individually or else together, for example. They can be influenced particularly by the same measured variable, so that compensation for interference variables, particularly the temperature, is possible.

In particular, the apparatus can have a first measurement inductance and a second measurement inductance, wherein the first measurement inductance is arranged at a first longitudinal end of the first inductance and the second measurement inductance is arranged at a second longitudinal end of the first inductance. Such an embodiment has been found to be advantageous for typical applications.

The electronic control unit can, according to one preferred embodiment, have a direct digital synthesis (DDS) module in order to generate the excitation frequency. Such DDS modules are known in the prior art and allow the almost continuously variable adjustment of the excitation frequency for a prescribed clock. They are typically not part of a microcontroller, but can be used, or added to a design, particularly for a specially developed control unit, particularly as an application-specific standard product.

A DDS module typically allows much finer adjustment of the excitation frequency than is possible by dividing down a system clock. If a system clock of 24 MHz is used, for example, then a factor of 5 can be used to achieve an excitation frequency of 4.8 MHz. The next highest factor of 6 can be used to achieve an excitation frequency of 4 MHz. By comparison, the excitation frequency can be adjusted almost continuously by means of a typical DDS module.

A few explanations in regard to DDS modules are provided below.

DDS means "direct digital synthesis" and denotes a process known per se that can be combined here with the inductive sensor system in the style of a lock-in amplifier and with all the features cited in this application in an ASIC/ASSP or in another control unit. This typically involves an oscillator of fixed frequency being used in order to generate frequencies that are almost arbitrarily selectable in a particular range. This is typically accomplished by using a register, i.e. a memory for a digitally represented number, that stores the respective present value of the phase of the signal to be output. In every clock cycle of the oscillator, the value of a further register, the increment register, is typically added to the first register, the phase register. In every cycle, the value of the phase register thus increases by a constant value and is therefore proportional to time. The maximum numerical range that the phase register can represent corresponds in this case to the period of the signal to be output. Therefore, when the phase register overflows, no special measures need to be taken; in the next signal period the phase values simply assume values rising from the most negative value again in the chosen numerical representation, usually two's complement.

The output of the phase register typically has a digital memory (e.g. a ROM) connected to it, the address of which is obtained from the phase register. In the simplest case, the register bits are then directly connected to the address lines of the memory. For the most part, a configuration is chosen in which the word length of the phase register comprises distinctly more bits than the number of address lines of the memory. This is particularly advantageous. In that case, the memory is connected to the most significant address lines. The less significant bits of the phase register allow a particularly precise phase value to be stored, however.

In connection with a corresponding design of the increment register, which likewise contains these bits, the frequency can then be adjusted in particularly narrow increments.

The memory typically has the task of mapping the curve shape of the signal to be output. It particularly advantageously stores the profile of a sine curve. By virtue of the address of the memory now being prescribed by the phase register, it likewise increases proportionally with respect to time, with the increment register presenting the proportionality constant, i.e. the frequency. At the output of the memory there are therefore successive data words that, in the chosen numerical representation, are consistent with e.g. a sine curve.

The data words are typically supplied to a D/A converter, the output of which is connected to the port pin at which the electronic control unit provides the stimulus for the circuit, instead of to a simple inverter. One D/A converter is needed per stimulus port pin, and it may be possible for partial structures of the converters to be used together in order to save silicon surface area. It is advantageous for the design of the D/A converters to connect inverters having staggered current-carrying capability in parallel and to activate the individual transistors by means of the data words of the memory, instead of using a standard converter that uses the voltage as output variable. Inverters having staggered current-carrying capability arise particularly as a result of transistors of different size (above all channel width for MOS transistors, emitter surface area for bipolar transistors).

For maximum simplicity and minimised silicon surface area for the system, it is possible to keep particular power characteristics of the combination of DDS and digital-to-analog (D/A) converter intentionally at very low values that are otherwise hardly found. Since e.g. the harmonic content at the output of the D/A converter has only minimal influence on the measurement result (the system typically also works with a square-wave stimulus), the word length of the D/A converter can be kept small. Moreover, only a single signal form and amplitude needs to be able to be output. It is therefore not necessary to make the signal values that can be output by the D/A converter equidistant. The D/A converter is only meant to be able to produce the values that are needed by this signal form and amplitude. For a sinusoidal output, this means that the steps in the middle of the range can be staggered coarsely, whereas those at the edges of the range can be staggered finely. For this embodiment, the memory then contains no further values that represent a non-linear profile in its numerical space. In the simplest case, the memory can then be replaced by a combination of counters.

For the application in inductive sensor technology, the circuit with DDS and digital-to-analog converter has two important advantages, both of which are based on the value of the increment register, which does not change when a signal is output at constant frequency, being able to be controlled by a superordinate logic unit, which may particularly be integrated in the electronic control unit. This is consistent with frequency modulation (FM) of the stimulus.

First, the system can use the customisation of the stimulus frequency to look for the resonant frequency of the connected resonant circuit in the course of operation. Tolerances in this resonant frequency, whether as a result of variation of production parameters or influences such as temperature, for example, consequently become insignificant. In addition, at the resonant frequency, the circuit always operates at the maximum in terms of the filter action of the resonant circuit, the spectral purity of the signals, the amplitude of the magnetic field for a given stimulus current and, as a result of this, for a maximum signal-to-noise ratio.

All of these properties can, without the frequency modulation, typically be realised only approximately, specifically particularly in a manner limited by the tolerance of the resonant frequency. In this connection, it must be stressed that the resonant circuit still executes enforced oscillations at a fixed, externally prescribed frequency and does not oscillate freely at resonance, for example. Should the Q factor of the resonant circuit be too high, then the program of the microcontroller can likewise provide for the resonant frequency to be avoided in order to avoid exceeding the input voltage range for the induced voltages on the measurement side. Similarly, the measurement options are broadened for inductive systems whose resonant frequency can change severely during operation as a result of the measured variable. The program of the microcontroller can then provide for the resonant frequency to be followed in order to achieve a respective large amplitude for the induced voltages and to use the measured resonant frequency as a measured value, or to incorporate it into the computation.

Using an entirely similar program, but without a search for resonance, the same circuit can perform impedance spectroscopy and thereby extract much more information from the inductive system. Impedance spectroscopy means measuring spectra of the parameters of the inductive system. Finally, any operation at resonant frequency means minimisation of power loss.

The advantages and options just described result in an advantageous embodiment. According to this embodiment, the electronic control unit is configured to alter the excitation frequency in order to ascertain a resonant frequency of the parallel resonant circuit. This can be used for various control tasks that are based on the resonant frequency. In particular, the electronic control unit may further be configured to adjust the excitation frequency to be identical to the resonant frequency or adjacent to the resonant frequency. In particular, a desired spacing, for example relative or absolute, between the excitation frequency and the resonant frequency may be prescribed. This spacing may be positive or negative.

Second, the frequency modulation can be used for interference rejection if either the measurement frequency is continually slightly altered within a measurement range, so that every narrowband source of interference actually interferes only in a portion of the measurement range, or the program of the microcontroller looks for frequencies at which a particularly high signal-to-noise ratio is found, so as then to remain at these frequencies for as long as conditions do not worsen.

This results in a preferred embodiment in which the electronic control unit is configured to identify when an exceeding of a maximum level has occurred or is imminent on a port pin, and to respond thereto by changing the excitation frequency, particularly by spacing it further apart from the resonant frequency of the parallel resonant circuit. This allows an exceeding of permissible levels with its typical consequences, such as measurement errors or damage, to be avoided in a simple and reliable manner.

The electronic control unit may be configured to carry out interference rejection.

To this end, the excitation frequency can be varied continuously within a measurement range, for example between a lower frequency and an upper frequency. This allows the elimination of interference variables, which are typically active only in a narrow frequency range, so that during the variation the excitation frequency sweeps over a frequency of the interference variable only for a relatively short time.

The excitation frequency can also be varied within a measurement range, the excitation frequency being taken as a basis for ascertaining a signal-to-noise ratio. Subsequently, the excitation frequency is set to a value having a maximum signal-to-noise ratio. This allows automated and simple optimisation of the signal-to-noise ratio.

The electronic control unit has, according to a preferred embodiment, at least one analog multiplier that is connected to a port pin for connection of the measurement inductance and to a signal module. In this case, the signal module delivers an oscillating signal at a frequency having a defined, in particular small, spacing from the excitation frequency.

The spacing may be 5% or 10%, for example. The signal module is preferably set up as a direct digital synthesis (DDS) module.

An output signal of the analog multiplier, particularly a signal component at the difference frequency, is preferably processed further in the electronic control unit to ascertain the measured variable.

In regard to the use of an analog multiplier, the explanations below are provided.

In addition to the DDS, it is possible for a function block to be inserted that is typically likewise not included in microcontrollers. This is an analog multiplier as a mixer that can receive at one of the inputs the signals from a respective one of the inductances to be measured, while the other input has an oscillation applied to it that can likewise be produced by a DDS block as outlined above. This oscillation is meant to have a frequency that differs from the frequency of the stimulus only by a few percent. At the output of the multiplier, an oscillation then appears that is a mixture of signals at the summed and difference frequencies. This isolation is forwarded to the ADC and processed there in the same manner. However, advantageously only the difference frequency is measured from the frequency mix by virtue of the already described digital filtering with DFT or a Goertzel filter being set to the difference frequency. Since the difference frequency is substantially lower, the measurement of this signal component makes much lower demands on the ADC and the clock generator, the phase noise and jitter of which can otherwise limit the accuracy of the measurement. By using a second DDS and multipliers (particularly one per measurement channel or one for all the measurement channels, in the latter case advantageously in the signal flow downstream of a multiplexer), it is therefore possible to achieve an improvement in the measurement properties that is likewise not possible with a microcontroller.

In this case, it is preferred for the frequency of the stimulus and the frequency that the second DDS block outputs not to be the same. The second DDS block would then typically also be superfluous, because the same signal would be able to be used in both cases. The difference frequency would be equal to zero, however, if the frequencies are the same, i.e. the output voltage is a DC voltage. Although this would facilitate the digital signal processing, because neither DFT nor a Goertzel filter would then be necessary, an oscillation at the non-zero difference frequency can be isolated better by filtering than the DC voltage. Moreover, the information content is greater, since the oscillation is characterised by amplitude, phase and mean value, the DC voltage only by one value.

Overall, the DDS module is then typically present twice, a digital-to-analog converter for the second DDS module being able to be embodied with smaller transistors or other circuit principles in order to save chip surface area, since the output affects only internal nodes of the circuit, of course.

The apparatus that can be designed using the electronic control unit according to the invention can have, for example, an oscillator, an optional amplifier, an inductive system, a resonant circuit capacitor, an optional measurement amplifier and a measurement system, particularly the measuring apparatus. The amplifier amplifies the signal of the oscillator and can be dispensed with, in particular, if the output of the oscillator already provides a sufficiently strong signal. This signal or that of the amplifier forms the stimulus for the inductive system that has the capacitor added to form the resonant circuit. In particular, the first inductance already mentioned further above and the measurement inductance, likewise already mentioned, can be regarded as an inductive system. If the output signal is too weak for the measurement system, an additional measurement amplifier can be used, otherwise the measurement system can be connected directly to the inductive system, in particular, for example by virtue of an electrical variable or multiple electrical variables being tapped off from the inductive system. The measurement system may, by way of example, be embodied as a lock-in amplifier (or phase-sensitive rectifier, synchronous demodulator or carrier frequency amplifier) implemented using analog or digital technology and possibly software and can use the oscillator signal as a reference signal to ascertain one or more characteristic values of the inductive system.

As a preference, the excitation frequency is adjustable. In particular, it may be adjustable by software. This allows modulation of the excitation frequency or the stimulus. Alternatively, the excitation frequency may also be firmly prescribed.

The electronic control unit may be set up or configured particularly as a lock-in amplifier for the measurement described herein. This can also be referred to as a phase-sensitive rectifier, synchronous demodulator or carrier frequency amplifier and has been found to be advantageous for the application that is relevant here.

The effect achieved by the described design of an inductive system and of a combination of the components described herein is that the peak in the variables critical to the measurement, as is characteristic of resonance, can be linked in conjunction with a signal processing path, as is known from the lock-in amplifier. This decreases the current requirement of an inductive sensor system, and/or the measurement resolution thereof is increased. For the practical design of inductive sensor systems with open magnetic circuits, typical values in the range from 3 to 8 can advantageously be used or expected for $Vt^2/V0$.

It should be understood that the invention also relates to an apparatus having an electronic control unit according to the invention. In this case, it is possible to resort to all the embodiments and variants described. The apparatus in all the variants can particularly also be claimed separately.

BRIEF DESCRIPTION OF THE DRAWINGS

Further features and advantages will be taken by a person skilled in the art from the exemplary embodiments described below with reference to the appended drawing.

DETAILED DESCRIPTION OF THE PREFERRED EMBODIMENTS

Figure 1:
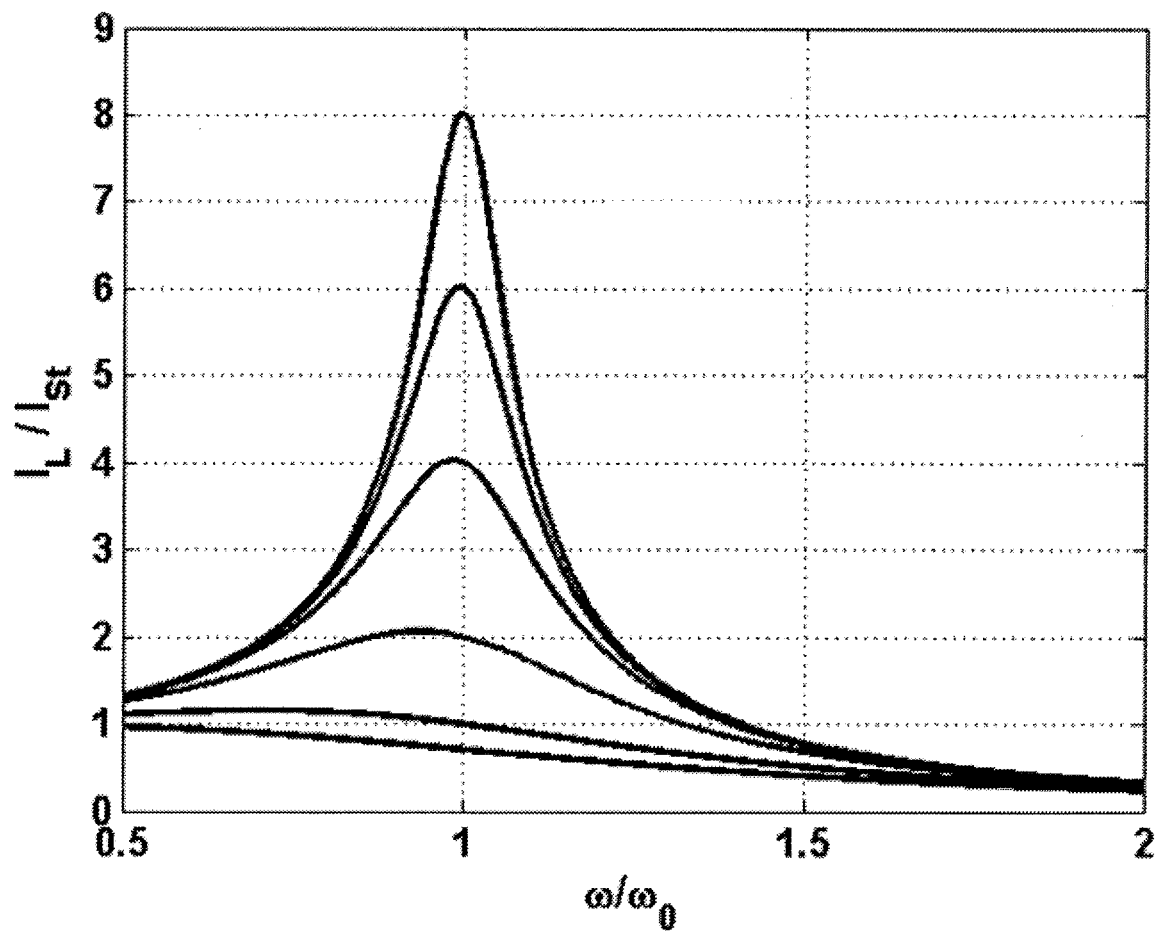
FIG. 1 shows exemplary profiles of a Q factor, which has already been discussed further above in this application.

FIG. 1 has already been mentioned and explained further above in the text.

Figure 2:
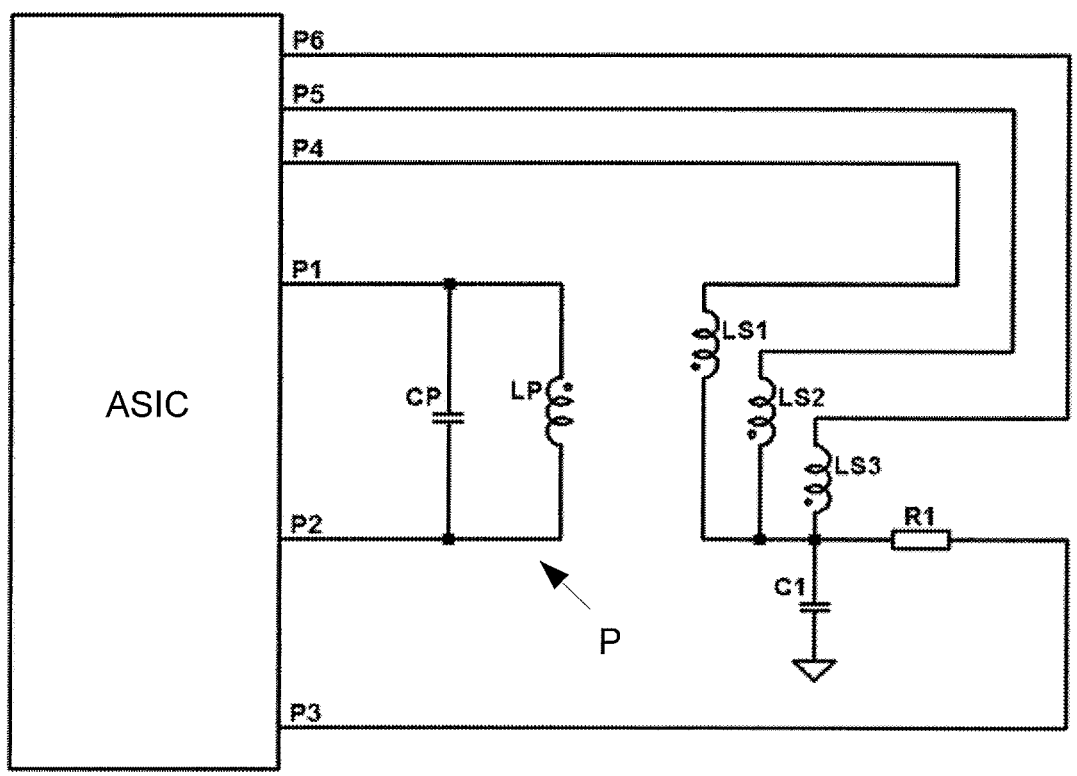
FIG. 2 shows an apparatus having an electronic control unit according to a first exemplary embodiment of the invention.

FIG. 2 shows an apparatus having an electronic control unit according to a first exemplary embodiment of the invention with an electronic control unit in the form of an application-specific integrated circuit (ASIC). In this case, an inductive system is embodied as a measurement transformer comprising a first inductance LP and three, measurement inductances, namely a first measurement inductance LS1, a second measurement inductance LS2 and a third measurement inductance LS3. A stimulus is provided by port pins P1 and P2 of the ASIC that are actuated by an internal DDS module at a provided excitation frequency or stimulus frequency.

Connected in parallel with the first inductance LP is a capacitance CP, as a result of which a parallel resonant circuit P is obtained. The oscillations of the resonant circuit P are continually maintained by alternating voltages at P1 and P2, so that an oscillation of constant amplitude is obtained.

The current through the first inductance LP causes a magnetic flux that also covers the measurement inductances LS1, LS2, LS3. The magnetic coupling is symbolised by the arrow. The percentage of the magnetic flux of the first inductance LP that also goes through the measurement inductances LS1, LS2 and LS3 is dependent on the measured variable in this case. In the present exemplary embodiment, the spacing between the first inductance LP and the measurement inductances LS1, LS2 and LS3 can change in order to measure said percentage.

There could alternatively also be a soft magnetic core or an electrically conductive body, for example, between the first inductance LP and the measurement inductances LS1, LS2 and LS3, however, the movement of which core or body is measured. Any arrangement that causes a parameter change in the inductive system is fundamentally possible.

Fundamentally, the magnetic flux in the measurement inductances LS1, LS2 and LS3 induces voltages that are supplied to port pins P4, P5, P6 of the ASIC. An advantage of the use of three inductances LS1, LS2 and LS3 instead of a single one is the opportunity to obtain more data for measuring the measured variable. Values of the measurement inductances LS1, LS2 and LS3 are thus dependent on the measured variable in different ways, so that any measurement errors on one of the measurement inductances LS1, LS2 and LS3 can be corrected by taking into consideration the measured values on all the measurement inductances LS1, LS2 and LS3 in computations. In particular, it is possible in this case to compensate for the typically most important interference variable, namely temperature. Alternatively, however, multiple measured variables can also be captured with a system.

The voltages on the port pins P4, P5, P6 are alternately supplied to an analog-digital converter (ADC) in the ASIC via an integrated multiplexer. The ADC captures each of these voltages repeatedly. From the multiplicity of samples that are ascertained by the ADC for each voltage, the amplitude and phase at the stimulus frequency is ascertained. Further steps in digital signal processing and software can be performed in order to finally determine the measured value for the measured variable from the amplitude and phase values.

As shown, the measurement inductances LS1, LS2 and LS3 have their respective poles that are opposite the poles connected to the port pins P4, P5, P6 connected to a common potential that is defined by a smoothing capacitor C1. The smoothing capacitor C1 has its pole that defines this potential connected to a port pin P3 of the ASIC via a resistor R1. To this port pin P3, the ASIC applies a pulse width modulated signal during operation in order to maintain a particular potential on the smoothing capacitor C1 on average. This potential corresponds to approximately half the supply voltage of the ASIC.

It should be explicitly pointed out that, apart from the aforementioned components ASIC, first inductance LP, measurement inductances LS1, LS2 and LS3, capacitance CP, smoothing capacitor C1 and resistor R1, there are no further components in the apparatus according to the exemplary embodiment shown. In particular, all the passive components are connected directly to the ASIC. The provision of additional active components such as amplifiers is thus dispensed with, which minimises the costs.

Figure 3:
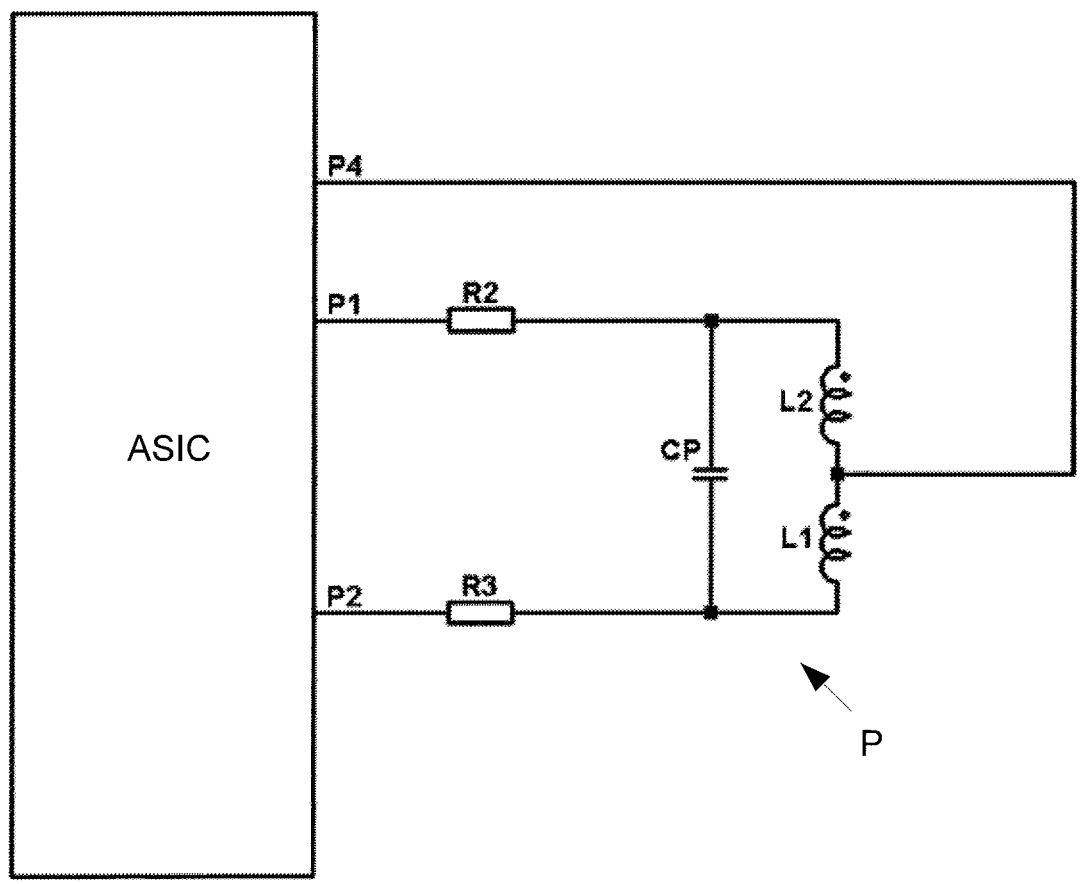
FIG. 3 shows an apparatus having an electronic control unit according to a second exemplary embodiment of the invention.

FIG. 3 shows an apparatus according to a second exemplary embodiment of the invention. In this case too, an ASIC is provided. The differences in the circuitry in comparison with the apparatus according to the first exemplary embodiment are explained below.

In the case of the apparatus according to the second exemplary embodiment, all the inductances are DC coupled. A parallel resonant circuit P is formed by a first inductance L1, a measurement inductance L2 and a capacitance CP. The measurement inductance L2 is sensitive to the measured variable and alters, while the first inductance L1 has a constant value. The connecting lines to the port pins P1, P2 contain resistors R2 and R3 that protect the port pins P1, P2 against excessively high currents. Between the first inductance L1 and the measurement inductance L2, a voltage is tapped off that oscillates at the stimulus frequency and whose amplitude and phase are dependent on the measured variable. For further aspects, reference is made to FIG. 2.

Figure 4:
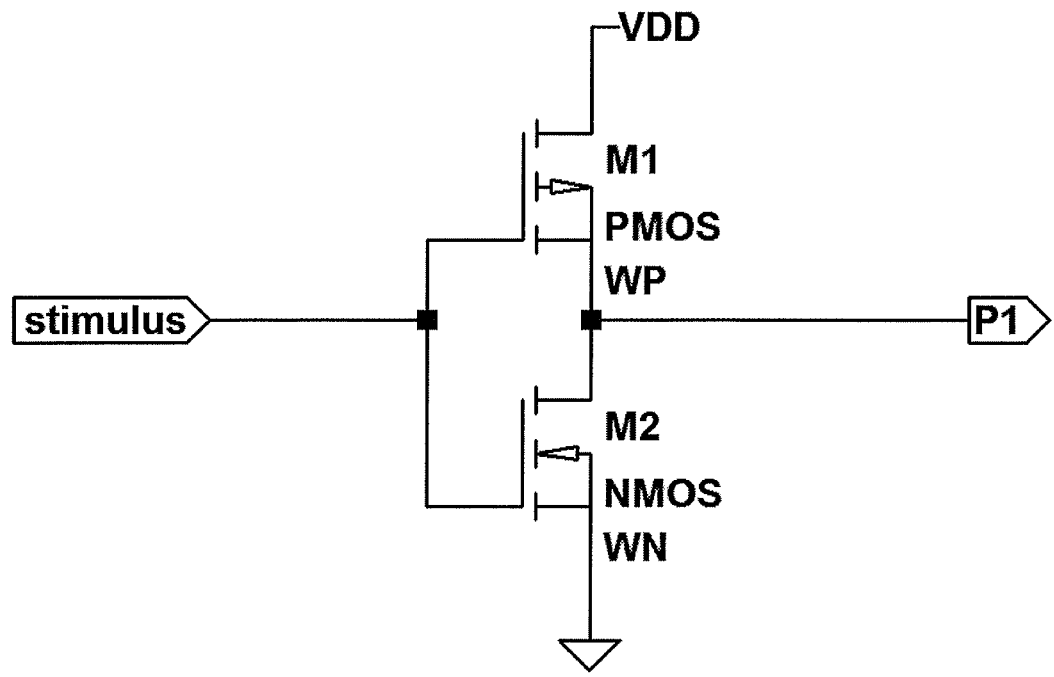
FIG. 4 shows internal circuitry for port pins.

FIG. 4 shows possible internal circuitry at P1 and P2, particularly in the event of the use of a standard port pin of an ASIC or another electronic component in CMOS technology. An inverter is formed from MOS transistors M1 and M2, the P-MOSFET M1 having the channel width WP and the N-MOSFET M2 having the channel width WN that matches it in the present technology. The circuit is controlled by the stimulus signal; its output is connected to the actual port pin P1, the same structure being able to be found again at P2. A supply voltage is denoted by VDD, which also applies to other figures.

Figure 5:
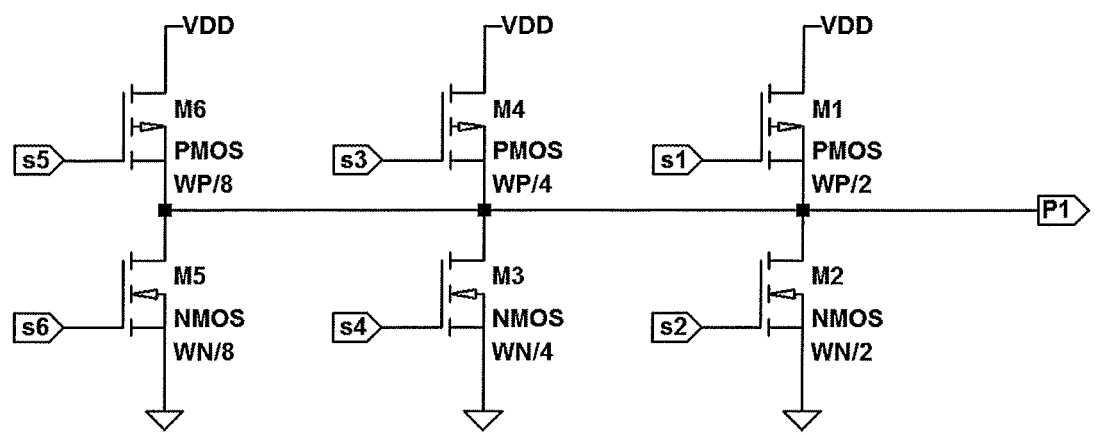
FIG. 5 shows an embodiment of a digital-to-analog converter.

One possible embodiment of a digital-to-analog converter is shown in FIG. 5. There are now three inverters with the transistors M1 to M6, the channel width of the transistors being staggered and assuming the values WP/2, WP/4 and WP/8 and WN/2, WN/4 and WN/8. On the input side, the transistors are not connected as inverters but rather are supplied with input signals s1 to s6. These input signals can be connected such that in each case one or more of the P-MOSFETs M1, M4, M6 turn on or one or more of the N-MOSFETs M2, M3, M5 turn on, but never transistors in both groups, because this would merely result in a useless direct flow of current from the supply voltage VDD to ground. Together with the likewise permissible case in which all the transistors are off, 15 states of the digital-to-analog converter (7 combinations with P-MOSFETs on, 7 combinations with N-MOSFETs on, and all off) are therefore obtained. The states differ in the impedance between P1 and one of the supply voltages (VDD or ground) and the respective supply voltage. As a result, the stimulus can be produced at 15 impedance and voltage levels and corresponding currents instead of just two levels if the signals s1 to s6 are cyclically altered such that all levels are passed through. The circuit is very efficient in terms of its silicon surface area, because the surface area used up is definitively determined by the channel width, and the summed channel width of the transistors M1 to M6 does not exceed that from FIG. 4. Put another way, the same summed channel width is needed for the same summed current-carrying capability in both cases.

Figure 6:
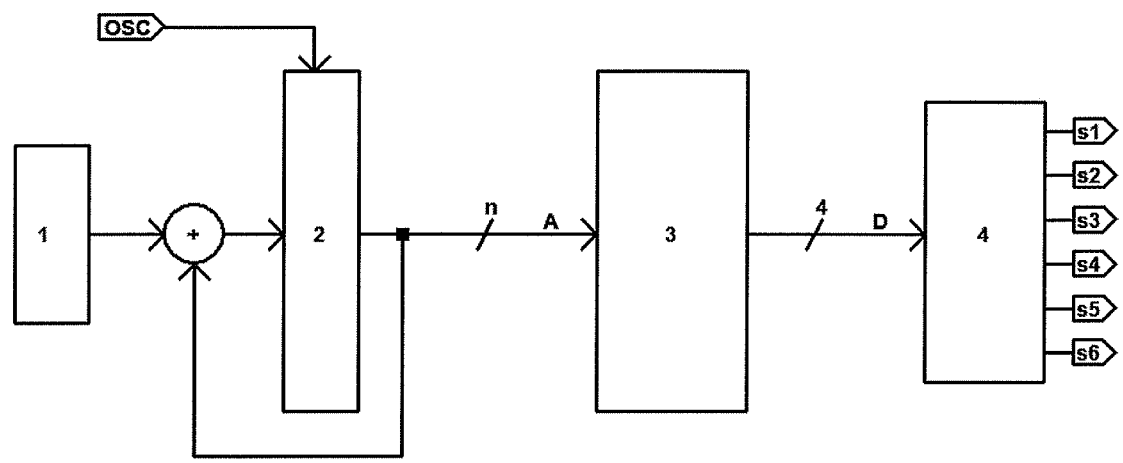
FIG. 6 shows a circuit for signal generation by means of DDS.

A circuit for generating the signals s1 to s6 by means of DDS is shown in FIG. 6. The outputs of an increment register 1 and of a phase register 2 act on an adder whose output is connected to the input of the phase register 2. On every pulse at the clock input of the phase register, which is supplied with an oscillator signal OSC of fixed frequency, this increases the value of the phase register by the value of the increment register. In this exemplary embodiment, the content of the increment register is assumed to be a constant and therefore no input for setting this register is depicted. The output of the phase register 2 is connected to the address bus A of a memory 3, as a result of which particular addresses of the memory 3 are selected. The address bus has a width of n bits. At the output of the memory 3, on the data bus D, there then appear the data words corresponding to the addresses. The data bus in this case has a width of 4 bits, because the 15 states of the corresponding digital-to-analog converter from FIG. 5 can be coded with 4 bits. The data words of the data bus D are supplied to a decoder 4 that performs the conversion to the signals s1 to s6. Each of the 15 opportunities to set the digital-to-analog converter to a particular output value has a corresponding particular data word having 4 bits and a corresponding applicable combination of the signals s1 to s6. The combination of the increment register 1, the phase register 2, the adder and the memory 3 is usually called DDS.

The claims that are part of the application do not represent any dispensing with the attainment of further protection.

If it turns out in the course of the process that a feature or a group of features is not absolutely necessary, then the applicant aspires right now to a wording for at least one independent claim that no longer has the feature or the group of features. This may be, by way of example, a subcombination of a claim present on the filing date or may be a subcombination of a claim present on the filing date that is limited by further features. Such claims or combinations of features requiring rewording can be understood to be covered by the disclosure of this application as well.

It should further be pointed out that refinements, features and variants of the invention that are described in the various embodiments or exemplary embodiments and/or shown in the figures are combinable with one another in any way. Single or multiple features are interchangeable with one another in any way. Combinations of features arising therefrom can be understood to be covered by the disclosure of this application as well.

Back-references in dependent claims are not intended to be understood as dispensing with the attainment of independent substantive protection for the features of the back-referenced subclaims. These features can also be combined with other features in any way.

Features that are disclosed only in the description or features that are disclosed in the description or in a claim only in conjunction with other features may fundamentally be of independent significance essential to the invention. They can therefore also be individually included in claims for the purpose of distinction from the prior art.

The invention claimed is:

1. An electronic control unit for an apparatus for measuring a measured variable, wherein the electronic control unit includes:
   at least one output port configured to be connected directly to a parallel resonant circuit that is formed from a first inductance and a capacitance, the at least one output port outputting a voltage signal to excite the parallel resonant circuit into oscillation at an excitation frequency that is derived from a clock of the electronic control unit,
   a plurality of input ports configured to be connected directly to a plurality of measurement inductances that are magnetically coupled to the first inductance to detect different percentages of a magnetic flux of the first inductance that are dependent on the measured variable and generate measurement signals based on the different percentages of the magnetic flux, and
   a processor configured to correct a measurement error in at least one of the measurement signals based on at least another one of the measurement signals and compute the measured variable using measurement signals input to the plurality of input ports by the plurality of measurement inductances.

2. The electronic control unit as claimed in claim 1, wherein the electronic control unit is set up for the parallel resonant circuit to be connected to a first port pin and to a second port pin of the electronic control unit, the second port pin being supplied with an excitation signal that is inverted in relation to the first port pin.

3. The electronic control unit as claimed in claim 2, wherein the electronic control unit is set up for the parallel resonant circuit:
   to be connected in parallel with the first port pin to a number of further first port pins that are connected to the first port pin in sync,
   and/or
   to be connected in parallel with the second port pin to a number of further second port pins that are connected to the second port pin in sync.

4. The electronic control unit as claimed in claim 1, wherein port pins that are set up for connection of the parallel resonant circuit have a respective push-pull output stage or a tri-state output stage.

5. The electronic control unit as claimed in claim 1, wherein the electronic control unit is set up as an application-specific integrated circuit, ASIC, and/or as an application-specific standard product, ASSP.

6. The electronic control unit as claimed in claim 1, wherein the electronic control unit is set up to measure the measurement inductances when they have a first pole connected to a port pin of the electronic control unit and have a second pole connected to a potential that corresponds to at least approximately half the supply voltage of the electronic control unit.

7. The electronic control unit as claimed in claim 6, wherein the electronic control unit is set up to output a pulsed signal, on a port pin in order to produce the potential that corresponds to at least approximately half the supply voltage of the electronic control unit by a smoothing capacitor.

8. The electronic control unit as claimed in claim 7, wherein the electronic control unit is configured to first of all, when it is switched on, charge the smoothing capacitor to at least approximately half the supply voltage, while port pins to which the parallel resonant circuit is connected have the same logic level and begin excitation of the parallel resonant circuit only afterwards.

9. The electronic control unit as claimed in claim 1, wherein the electronic control unit has an analog-to-digital converter in order to capture a signal generated by the measurement inductances, and is configured to take into consideration aliasing when determining characteristic values of said signal.

10. The electronic control unit as claimed in claim 1, wherein
the electronic control unit is configured to ascertain a frequency component at an evaluation frequency from a captured signal,
wherein the evaluation frequency is the excitation frequency or an alias of the excitation frequency.

11. The electronic control unit as claimed in claim 1, wherein
the electronic control unit has a direct digital synthesis module in order to generate the excitation frequency.

12. The electronic control unit as claimed in claim 1, wherein
the electronic control unit is configured to alter the excitation frequency in order to ascertain a resonant frequency of the parallel resonant circuit, and to set the excitation frequency to be identical to the resonant frequency or adjacent to the resonant frequency.

13. The electronic control unit as claimed in claim 1, wherein
the electronic control unit is configured to identify when an exceeding of a maximum level has occurred or is imminent on a port pin, and to respond thereto by changing the excitation frequency, by spacing it further apart from the resonant frequency of the parallel resonant circuit.

14. The electronic control unit as claimed in claim 1, wherein
the electronic control unit is configured to carry out interference rejection, to which end:
the excitation frequency is varied continuously within a measurement range, and/or
the excitation frequency is varied within a measurement range and the excitation frequency is taken as a basis for ascertaining a signal-to-noise ratio, the excitation frequency subsequently being set to a value having a maximum signal-to-noise ratio.

15. The electronic control unit as claimed in claim 1, wherein
the electronic control unit has at least one analog multiplier that is connected to a port pin for connection of the measurement inductances and to a signal module,
wherein the signal module delivers an oscillating signal at a frequency having a defined spacing from the excitation frequency,
wherein the signal module is set up as a direct digital synthesis (DDS) module, and wherein an output signal of the analog multiplier, particularly a difference signal, is processed further in the electronic control unit to ascertain the measured variable.

16. The electronic control unit as claimed 7, wherein the pulsed signal a signal has a prescribed duty ratio.

17. The electronic control unit as claimed in claim 9, wherein the characteristic values of said signal are amplitude, phase, real part and/or imaginary part, at the excitation frequency.

18. An electronic control unit for an apparatus for measuring a measured variable, wherein the electronic control unit includes:
at least one output port configured to be connected directly to a parallel resonant circuit that is formed from a first inductance, a measurement inductance and a capacitance, the first inductance is connected in series with the measurement inductance, the at least one output port outputting a voltage signal to excite the parallel resonant circuit into oscillation at an excitation frequency that is derived from a clock of the electronic control unit,
an input port configured to be connected between the first inductance and the measurement inductance to detect the measured variable, and
a processor configured to measure a value revealing the measured variable using a measurement signal input to the input port by the measurement inductance.

* * * * *